United States Patent [19]
Lines

[11] Patent Number: 6,061,277
[45] Date of Patent: May 9, 2000

[54] DYNAMIC MEMORY WORD LINE DRIVER SCHEME

[75] Inventor: Valerie L. Lines, Ottawa, Canada

[73] Assignee: Mosaid Technologies Incorporated, Kanata, Canada

[21] Appl. No.: 09/123,112

[22] Filed: Jul. 27, 1998

Related U.S. Application Data

[63] Continuation of application No. 08/515,904, Aug. 16, 1995, Pat. No. 5,822,253, which is a continuation of application No. 08/031,898, Mar. 16, 1993, abandoned, which is a continuation of application No. 07/680,746, Apr. 5, 1991, Pat. No. 5,214,602.

[30] Foreign Application Priority Data

Apr. 6, 1990 [GB] United Kingdom ............... 9007790
Apr. 5, 1991 [GB] United Kingdom ............... 9107165

[51] Int. Cl.$^7$ .................................................. G11C 16/04
[52] U.S. Cl. ............................. 365/189.11; 365/230.06; 365/226
[58] Field of Search ....................... 365/189.11, 230.06, 365/149, 226

[56] References Cited

U.S. PATENT DOCUMENTS

| | | | |
|---|---|---|---|
| 4,189,782 | 2/1980 | Dingwall | 365/190 |
| 4,442,481 | 4/1984 | Brahmbhatt | 365/226 |
| 4,583,157 | 4/1986 | Kirsch et al. | 363/60 |
| 4,689,504 | 8/1987 | Raghunathan et al. | 365/226 |
| 4,692,638 | 9/1987 | Stiegler | 307/449 |

(List continued on next page.)

FOREIGN PATENT DOCUMENTS

| | | |
|---|---|---|
| 197505 | 10/1986 | European Pat. Off. . |
| 59-213090 | 12/1984 | Japan . |
| 3-086995 | 4/1991 | Japan . |

OTHER PUBLICATIONS

Kitsukawa, Goro et al., "An Experimental 1–Mbit BiCMOS DRAM," IEEE Journal of Solid–State Circuits, vol. SC–22, No. 5, Oct. 1987.

Ishihara et al., "256k CMOS Dynamic RAM With Static Column Mode of Cycle Time of 50 ns," Nikkei Electronics, Feb. 11, 1985, pp. 243–263.

Kitsukawa, Goro et al., "A 1–Mbit BiCMOX DRAM Using Temperature–Compensation Circuit Techniques," IEEE Journal of Solid–State Circuits, vol. 24, No. 3, Jun. 1989, pp. 597–601.

(List continued on next page.)

*Primary Examiner*—A. Zarabian
*Attorney, Agent, or Firm*—Hamilton, Brook, Smith & Reynolds, P.C.

[57] ABSTRACT

A circuit which accurately controls the word line (pass transistor gate) driving voltage to a voltage which is both controlled and is not significantly greater than is needed to drive the word line. The elements of the present invention eliminate the need for a double-boot-strapping circuit, and ensure that no voltages exceed that necessary to fully turn on a memory cell access transistor. Accordingly, voltages in excess of that which would reduce reliability are avoided, and accurate driving voltages are obtained. A DRAM is comprised of word lines, memory cells having enable inputs connected to the word lines, apparatus for receiving word line selecting signals at first logic levels $V_{ss}$ and $V_{dd}$, and for providing a select signal at levels $V_{ss}$ and $V_{dd}$, a high voltage supply source $V_{pp}$ which is higher in voltage than $V_{dd}$, a circuit for translating the select signals at levels $V_{ss}$ and $V_{dd}$ to levels $V_{ss}$ and $V_{pp}$ and for applying it directly to the word lines for application to the enable inputs whereby an above $V_{dd}$ voltage level word line is achieved without the use of double boot-strap circuits.

6 Claims, 1 Drawing Sheet

U.S. PATENT DOCUMENTS

| | | | |
|---|---|---|---|
| 4,716,313 | 12/1987 | Hori et al. | 365/230.06 |
| 4,730,132 | 3/1988 | Watanabe et al. | 307/446 |
| 4,814,647 | 3/1989 | Tran | 365/226 |
| 4,857,763 | 8/1989 | Sakurai et al. | 307/443 |
| 4,878,201 | 10/1989 | Nakaizumi | 365/189.11 |
| 4,888,738 | 12/1989 | Wong et al. | 365/189.06 |
| 5,010,259 | 4/1991 | Inoue et al. | 307/482 |
| 5,031,149 | 7/1991 | Matsumoto et al. | 365/189.11 |
| 5,038,327 | 8/1991 | Akaogi | 365/230.06 |
| 5,150,325 | 9/1992 | Yanagisawa et al. | 365/177 |
| 5,347,488 | 9/1994 | Matsusbita | 365/189.11 |
| 5,351,217 | 9/1994 | Jeon | 365/230.06 |
| 5,377,156 | 12/1994 | Watanabe et al. | 365/227 |
| 5,751,643 | 5/1998 | Lines | 365/189.11 |

OTHER PUBLICATIONS

Kitsukawa, Goro et al., "A 23–ns 1–Mb BiCMOS DRAM," IEEE Journal of Solid–State Circuits, vol. 25, No. 5, Oct. 1990, pp. 1102–1111.

Nakagome, Yoshinobu et al, "An Experimental 1.5–V 64–Mb DRAM," IEEE Journal of Solid–State Circuits, vol. 26, No. 4, Apr. 1991, pp. 436–472.

Fujii, Syuso et al., "A 45–ns 16–Mbit DRAM with Triple–Well Structure," IEEE Journal of Solid–State Circuits, vol. 24, No. 5, Oct. 1989, pp. 1170–1174.

Gillingham, Peter et al., "High Speed, High Reliability Circuit Design for Megabit DRAM," IEEE Journal of Solid–State Circuits, vol. 26, No. 8, Aug. 1991, pp. 1171–1175.

DYNAMIC MEMORY WORD LINE DRIVER SCHEME

This is a continuation of Ser. No. 08/515,904, filed Aug. 16, 1995 U.S. Pat. No. 5,822,253, which is a continuation of Ser. No. 08/031,898, Mar. 16, 1993, abandoned, which is a continuation of Ser. No. 07/680,746, filed Apr. 5, 1991, U.S. Pat. No. 5,214,602.

FIELD OF THE INVENTION

This invention relates to CMOS dynamic random access memories (DRAMs), and particularly to word line drivers.

BACKGROUND TO THE INVENTION

Dynamic random access memories are generally formed of a matrix of bit lines and word lines with memory cells located adjacent the intersections of the bit lines and word lines. The memory cells are enabled to provide their stored bits to the bit lines or to permit a write operation by signals carried on the word lines.

Each memory cell is typically formed of a bit storage capacitor connected to a reference voltage and through the source-drain circuit of an "access" field effect transistor to an associated bit line. The gate of the field effect transistor is connected to the word line. A logic signal carried by the word line enables the transistor, thus allowing charge to flow through the source-drain circuit of the transistor to the capacitor, or allowing charge stored on the capacitor to pass through the source-drain circuit of the access transistor to the bit line.

In order for the logic level $V_{dd}$ potential from the bit line to be stored on the capacitor, the word line must be driven to a voltage above $V_{dd}+V_{tn}$, where $V_{tn}$ is the threshold voltage of the access transistor including the effects of back bias.

During the early days of DRAM design, NMOS type FETs, that is, N-channel devices were used exclusively. In order to pass a $V_{dd}+V_{tn}$ level signal to the selected word line, the gate of the pass transistor had to be driven to at least $V_{dd}+2V_{tn}$. Furthermore, to allow sufficient drive to achieve a voltage greater than $V_{dd}+V_{tn}$ on the word line within a reasonable length of time in order to facilitate a relatively fast memory, the gate of the pass transistor is driven to a significantly higher voltage. In such devices, the word line driving signal utilized capacitors in a well-known double-boot strap circuit.

In the above circuit, the boot strapping voltage circuit is designed to exceed the voltage $V_{dd}+2V_{tn}$, in order to ensure that temperature, power supply, and process variations would never allow the pass transistor driving voltage to fall below $V_{dd}+2V_{tn}$.

However, it has been found that in small geometry VLSI memories, the high voltages provided by the boot-strap circuits can exceed the tolerable voltages in the memory, thus adversely affecting reliability.

SUMMARY OF THE INVENTION

The present invention is a circuit which accurately controls the word line (pass transistor gate) driving voltage to a voltage which is both controlled and is not significantly greater than is needed to drive the word line. The elements of the present invention eliminate the need for a double-boot-strapping circuit, and ensure that no voltages exceed that necessary to fully turn on a memory cell access transistor. Accordingly, voltages in excess of that which would reduce reliability are avoided, and accurate driving voltages are obtained.

According to an embodiment of the invention a dynamic random access memory (DRAM) is comprised of word lines, memory cells having enable inputs connected to the word lines, apparatus for receiving word line selecting signals at first logic levels $V_{ss}$ and $V_{dd}$, and for providing a select signal at levels $V_{ss}$ and $V_{dd}$, a high voltage supply source $V_{pp}$ which is higher in voltage than $V_{dd}$, a circuit for translating the select signals at levels $V_{ss}$ and $V_{dd}$ to levels $V_{ss}$ and $V_{pp}$ and for applying it directly to the word lines for application to the enable inputs whereby an above $V_{dd}$ voltage level word line is achieved without the use of double boot-strap circuits.

According to another embodiment, a dynamic random access memory (DRAM) is comprised of bit lines and word lines, memory cells connected to the bit lines and word lines, each memory cell being comprised of an access field effect transistor (FET) having its source-drain circuit connected between a bit line and a bit charge storage capacitor, the access field effect transistor having a gate connected to a corresponding word line; a high supply voltage source $V_{pp}$; a circuit for selecting the word line and a circuit having an input driven by the selecting apparatus for applying the $V_{pp}$ supply voltage to the word line.

BRIEF INTRODUCTION TO THE DRAWINGS

A better understanding of the invention will be obtained by reference to the detailed description below, in conjunction with the following drawings, in which:

FIG. 1 is a schematic diagram of the invention.

DESCRIPTION OF A PREFERRED EMBODIMENT OF THE INVENTION

Figure 1:
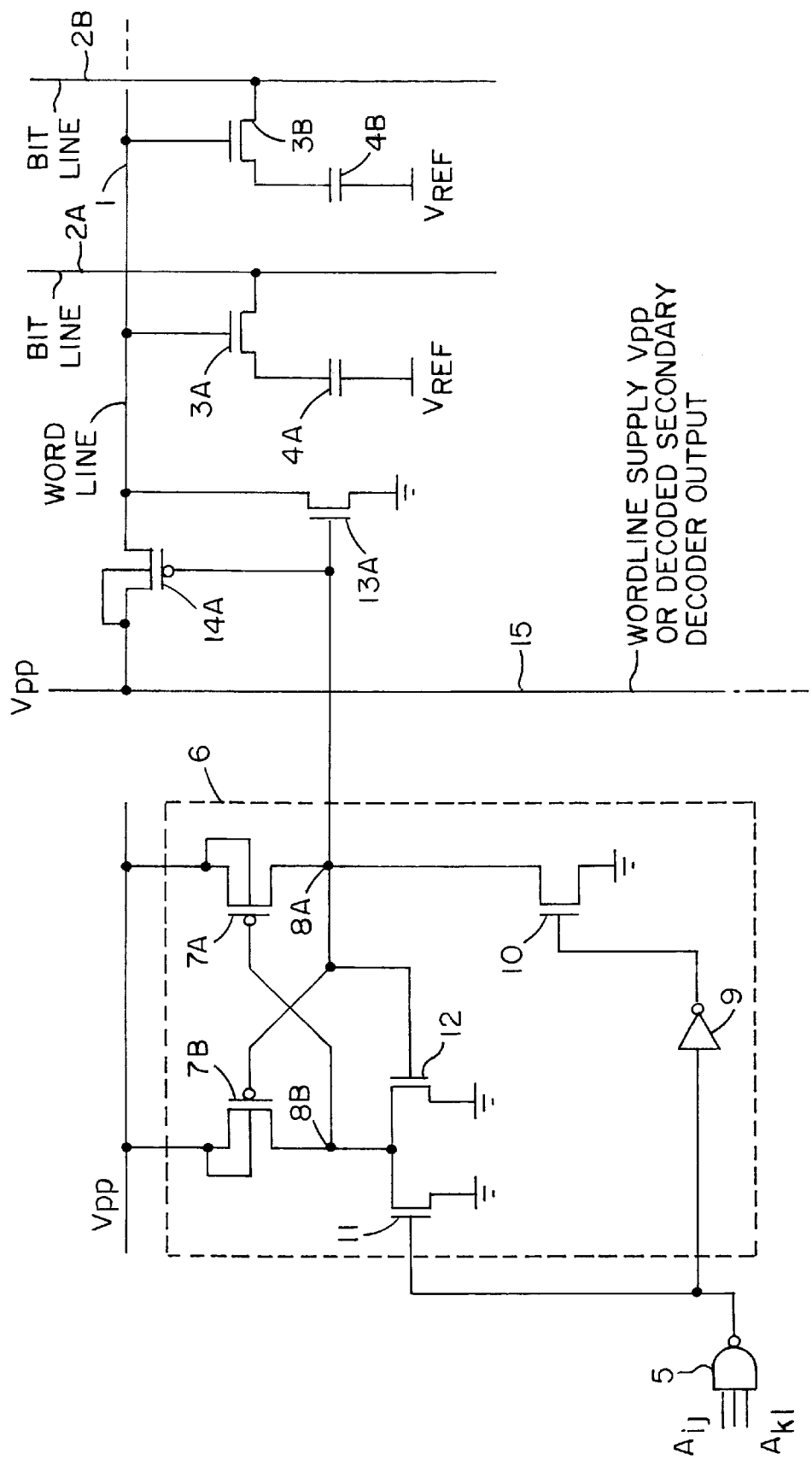

Turning now to FIG. 1, a CMOS DRAM is comprised of word lines, represented by word line 1 and bit lines, represented by bit lines 2A, 2B, etc. Access transistors 3A, 3B have their gates connected to the word line; their sources are connected to bit charge storing capacitors 4A, 4B, etc. which are also connected to ground. The drains of access transistors 3A, 3B, etc. are connected to the bit lines 2A, 2B, etc.

With the application of a logic signal of $V_{dd}+V_{tn}$ to the gate of transistor 3A, 3B, etc., $V_{dd}$ level on the bit line 2A, 2B, etc. is fully transferred to the associated capacitor 4A, 4B, etc. during the writing cycle. In the prior art it was necessary to apply a voltage greater than $V_{dd}+2V_{tn}$ to the gate of an N-channel pass transistor in order to ensure that a voltage in excess of $V_{dd}+V_{tn}$ would be available at the gates of transistors 3A, 3B, etc.

The combination of a bit storing charge capacitor, e.g. 4A, with an associated access transistor, e.g. 3A, forms a memory cell in prior art DRAMs.

The word line is selected by means of addresses $A_{ij}$ applied to the inputs of a NAND gate 5. In the prior art a double boot-strap circuit was connected between the output of NAND gate 5 and the word line.

In accordance with the present invention a voltage $V_{pp}$ which is higher than the logic level $V_{dd}+V_{tn}$ is utilized. A level shifter 6 is formed of a pair of cross coupled P-channel transistors 7A and 7B. The sources of transistors 7A and 7B are connected to the voltage source $V_{pp}$. The level shifter defines a first and a second control node, respectively 8A and 8B.

The output of NAND gate 5 is connected through an inverter 9 to the gate of an N-channel FET 10. FET 10 has its source connected to ground and its drain connected to control node 8A.

The output of NAND gate 5 is connected to the gate of an N-channel FET 11, which has its source connected to ground and its drain connected to control node 8B. A third N-channel FET 12 has its source connected to ground, its drain connected to the drain of transistor 11, and its gate to control node 8A.

Control node 8A (or a buffered version of control node 8A) is applied to the gate of pass transistor 14A and pull down transistor 13A. The source of pass transistor 14A is connected to $V_{pp}$ or to a secondary decoder output which provides a $V_{ss}$ or $V_{pp}$ level output; its drain to word line 1. The source of pull down transistor 13A is connected to ground; the drain is connected to word line 1.

In operation, assume that the word line 1 has not been selected. At least one address input of NAND gate 5 is low, causing the output of NAND gate 5 to be high, and the output of inverter 9 to be low. Transistor 11 is enabled, pulling node 8B to ground. Transistor 10 is disabled, allowing transistor 7A to charge node 8A to $V_{pp}$. Transistor 12 is thus enabled ensuring that node 8A is pulled high. The $V_{pp}$ level node 8A disables the pass device 14A and enables pull down transistor 13A so that word line 1 is held at ground. Thus transistors 3A and 3B are not enabled and are not conducting. The charge stored on capacitors 4A and 4B are thus maintained, and are not read to the bit lines.

Assume now that word line 1 is selected. Logic high level address signals at the voltage level $V_{dd}$ are applied to the inputs of NAND gate 5. The output of the NAND gate thus goes to low level. The output of inverter 9 changes to high level, transistor 10 is enabled, and pulls node 8A toward ground. This causes transistor 7B to be enabled, and pull node 8B toward $V_{pp}$. This causes transistor 7A to be disabled so that node 8A is pulled to ground, disabling transistor 12 and allowing transistor 7B to charge node 8B to $V_{pp}$. The ground level voltage on node 8A disables pull down transistor 13A, and enables the pass transistor 14A so that the word line 1 is driven to a $V_{pp}$ level. The voltage on the word line is thus controlled, and depending on whether the word line is selected or not, it switches between ground and $V_{pp}$. With the voltage $V_{pp}$ being controlled to $V_{dd}+V_{tn}$, the voltage at the gates of the cell access transistors 3A and 3B is certain to be $V_{dd}+V_{tn}$. However the voltage $V_{pp}$ is selected to be less than a voltage that would be in excess of that which would deteriorate reliability of the DRAM.

A person understanding this invention may now conceive of alternative structures and embodiments or variations of the above. All of those which fall within the scope of the claims appended hereto are considered to be part of the present invention.

What is claimed is:

1. A random access memory comprising:

a controlled high voltage supply;

word lines;

memory cells, each comprising a charge storage capacitor and a pass transistor for storing a logic level on the storage capacitor, the pass transistor having an enable input connected to a word line;

word line selection circuits, each selection circuit comprising:

a pair of cross-coupled transistors coupled drain-to-gate at respective control nodes and having respective sources coupled to the controlled high voltage supply;

a first pull-down transistor coupled to one of the control nodes and gated by a word line select signal; and a second pull-down transistor connected in parallel with the first pull-down transistor to said one of the control nodes, the gate of the second pull-down transistor being coupled to another of the control nodes.

2. A random access memory as claimed in claim 1 wherein the cross-coupled transistors are P-channel transistors and the pull-down transistors are N-channel transistors.

3. A random access memory as claimed in claim 2 wherein the other control node is coupled to a P-channel transistor and an N-channel pull-down transistor, each having a drain coupled to the word line.

4. A method of selecting a word line to enable a pass transistor which stores a logic level on a storage capacitor in a memory cell comprising:

pulling a first control node low through a first pull-down transistor;

pulling a second control node to a controlled high voltage supply logic level through a first of a pair of cross-coupled pull-up transistors, the first pull-up transistor having its gate coupled to the first control node, and a second of the pair of cross-coupled pull-up transistors having its gate coupled to the second control node;

maintaining the first control node low through a second pull-down transistor coupled in parallel with the first pull-down transistors, the second pull-down transistor having its gate coupled to the second control node.

5. A method as claimed in claim 4 wherein the cross-coupled transistors are P-channel transistors and the pull-down transistors are N-channel transistors.

6. A method as claimed in claim 4 further comprising enabling the word line from the second control node through a P-channel transistor and an N-channel pull-down transistor, each having a drain coupled to the word line.

* * * * *

Disclaimer 6,061,277—Valprie L. Lines, Ottawa, Canada. DYNAMIC MEMORY WORD LINE DRIVER SCHEME. Patent dated May 9, 2000. Disclaimer filed on October 4, 2002, by the Assignee, Mosaid Technologies Incorporated.

The term of this patent shall not extend beyond the expiration date of Patent Nos. 5,214,602, 5,751,643 and 5,822,253.

*(Official Gazette, July 22, 2003)*